(12) United States Patent
Zhang et al.

(10) Patent No.: US 12,532,616 B2
(45) Date of Patent: Jan. 20, 2026

(54) DISPLAY PANEL AND METHOD OF MANUFACTURING DISPLAY PANEL

(71) Applicant: Shenzhen China Star Optoelectronics Semiconductor Display Technology Co., Ltd., Guangdong (CN)

(72) Inventors: Qianyi Zhang, Guangdong (CN); Xingyu Zhou, Guangdong (CN)

(73) Assignee: Shenzhen China Star Optoelectronics Semiconductor Display Technology Co., Ltd., Guangdong (CN)

(*) Notice: Subject to any disclaimer, the term of this patent is extended or adjusted under 35 U.S.C. 154(b) by 690 days.

(21) Appl. No.: 17/764,188

(22) PCT Filed: Mar. 8, 2022

(86) PCT No.: PCT/CN2022/079660
§ 371 (c)(1),
(2) Date: Mar. 27, 2022

(87) PCT Pub. No.: WO2023/159675
PCT Pub. Date: Aug. 31, 2023

(65) Prior Publication Data
US 2023/0269977 A1    Aug. 24, 2023

(30) Foreign Application Priority Data
Feb. 22, 2022   (CN) .......................... 202210161332.2

(51) Int. Cl.
*H10K 59/131*   (2023.01)
*H10D 89/60*   (2025.01)
(Continued)

(52) U.S. Cl.
CPC ........... *H10K 59/131* (2023.02); *H10D 89/60* (2025.01); *H10K 71/00* (2023.02); *H10K 59/1201* (2023.02)

(58) Field of Classification Search
CPC ............. H10K 59/123; H10K 59/1275; H10K 59/805–80524; H10K 59/131–1315;
(Continued)

(56) References Cited

U.S. PATENT DOCUMENTS

2004/0149990 A1   8/2004  Oh et al.
2016/0013436 A1*  1/2016  Im ........................ H10K 50/805
                                                      257/40
(Continued)

FOREIGN PATENT DOCUMENTS

CN   105428313 A   3/2016
CN   105470262 A   4/2016
(Continued)

OTHER PUBLICATIONS

Chinese Office Action issued in corresponding Chinese Patent Application No. 202210161332.2 dated Aug. 23, 2024, pp. 1-7.

*Primary Examiner* — Matthew C Landau
(74) *Attorney, Agent, or Firm* — Rivka Friedman

(57) ABSTRACT

The present application discloses a display panel and a method of manufacturing the display panel. In the present application, by disposing the drain electrode, the source electrode, and the metal trace electrode on the first electrode layer, the present application reduces at least one source/drain metal layer compared with the prior art, so that the present application can reduce a number of layers of photomasks during the manufacturing process of the display panel, which can effectively reduce the production cycle and production cost of the display panel.

9 Claims, 11 Drawing Sheets

(51) Int. Cl.
*H10K 59/12* (2023.01)
*H10K 71/00* (2023.01)

(58) Field of Classification Search
CPC ........... H10K 59/1213; H05B 33/0896; H10D 86/60; H10D 86/6729
See application file for complete search history.

(56) References Cited

U.S. PATENT DOCUMENTS

2017/0170200 A1\* 6/2017 Ikeda ................. H01L 27/1225
2021/0376029 A1\* 12/2021 Yuan ..................... H01L 27/124
2021/0407976 A1 12/2021 Liang et al.
2022/0367598 A1\* 11/2022 Cho .................. H10K 59/1213

FOREIGN PATENT DOCUMENTS

| CN | 107424935 A | 12/2017 | |
|----|-------------|---------|---|
| CN | 108878503 A | 11/2018 | |
| CN | 110137084 A | 8/2019 | |
| CN | 111341814 A | 6/2020 | |
| CN | 111446295 A | 7/2020 | |
| CN | 111769123 A \* | 10/2020 | ............. H01L 21/77 |
| CN | 111863839 A | 10/2020 | |
| CN | 112420786 A | 2/2021 | |

\* cited by examiner

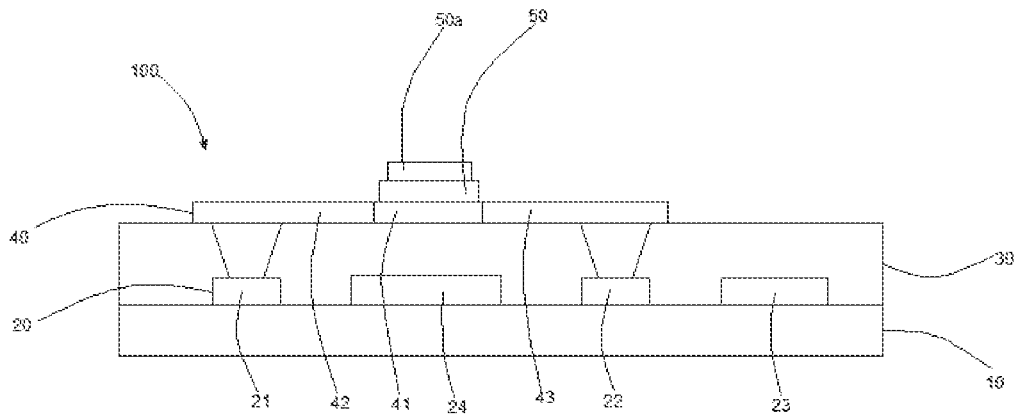

FIG. 6 providing a substrate, and forming a first electrode layer on the substrate; — S11 performing photolithography patterning on the first electrode layer to obtain a drain electrode, a source electrode, and a metal trace electrode; — S12 forming a buffer layer on the first electrode layer; — S13 depositing a second electrode layer on the buffer layer, and performing photolithography patterning on the second electrode layer to obtain a conductive channel; — S14 forming a first insulating layer on the conductive channel; and — S15 forming a gate electrode on the first insulating layer. — S16

FIG. 7 coating a photoresist layer on the fourth electrode layer; — S125 performing a photolithography process on the photoresist layer to obtain a photoresist pattern, wherein the photoresist pattern comprises a first photoresist pattern and a second photoresist pattern; — S126 etching to remove the first electrode layer and the fourth electrode layer exposed by the photoresist pattern; — S127 stripping off the first photoresist pattern, and etching to remove the first electrode layer and the fourth electrode layer under the first photoresist pattern to obtain the drain electrode, the source electrode, and the metal trace electrode; and — S128 stripping off the second photoresist pattern to obtain the fourth electrode layer on the metal trace electrode — S129

FIG. 12 performing ashing and thinning treatment on the photoresist pattern to strip off the first photoresist pattern; and — S1281 etching to remove the first electrode layer and the fourth electrode layer located under the first photoresist pattern to obtain the drain electrode, the source electrode, and the metal trace electrode — S1282

DISPLAY PANEL AND METHOD OF MANUFACTURING DISPLAY PANEL

BACKGROUND OF INVENTION

Field of Invention

The present application relates to a field of display technology, and in particular, to a display panel and a method of manufacturing the display panel.

Description of Prior Art

Organic light-emitting diode (OLED) device is a current-type light-emitting device, and the OLED device mainly includes an anode, a cathode, and an organic material functional layer. The main working principle of the OLED device is that the organic material functional layer emits light through injection and recombination of carriers under driving of an electric field formed by the anode and the cathode.

The existing OLED display panel includes: a TFT display panel including a thin film transistor (TFT) driving circuit, and a plurality of OLED display devices arranged on the TFT display panel, wherein each of the OLED display devices is controlled by a corresponding TFT. In printed OLED products, a top-emission backplane is generally used, and the organic layer is formed by inkjet printing. However, during the printing process of the existing OLED products, 10 layers of photomasks and multi-layered inorganic films need to be produced, resulting in a long production cycle and high cost.

SUMMARY OF INVENTION

The present application provides a display panel and a method of manufacturing the display panel, so as to reduce the cycle and cost of manufacturing the display panel.

The present application provides a display panel, which includes:
  a substrate;
  a first electrode layer disposed on the substrate, wherein the first electrode layer includes a drain electrode, a source electrode, and a metal trace electrode;
  a buffer layer disposed on the first electrode layer;
  a second electrode layer disposed on the buffer layer, wherein the second electrode layer includes a conductive channel, and the drain electrode and the source electrode are respectively connected to the conductive channel;
  a first insulating layer disposed on the conductive channel; and
  a gate electrode disposed on the first insulating layer.

Optionally, in some embodiments of the present application, the first electrode layer further includes a light-shielding electrode, and an orthographic projection of the light-shielding electrode on the substrate covers an orthographic projection of the conductive channel on the substrate projection.

Optionally, in some embodiments of the present application, the drain electrode, the light-shielding electrode, the source electrode, and the metal trace electrode are arranged in sequence at intervals.

Optionally, in some embodiments of the present application, the display panel further includes:
  a passivation layer disposed on the buffer layer and covering the gate electrode;
  a planarization layer disposed on the passivation layer; and
  a third electrode layer disposed on the planarization layer, wherein the third electrode layer includes a first connection electrode and an anode electrode of a light-emitting organic light-emitting diode (OLED) device;
  wherein the first connection electrode is connected to the metal trace electrode through a via hole in the buffer layer, the passivation layer, and the planarization layer, and the anode electrode is connected to the drain electrode.

Optionally, in some embodiments of the present application, the second electrode layer further includes a second connection electrode, the anode electrode is connected to the second connection electrode through a via hole in the passivation layer and the planarization layer, and the second connection electrode is connected to the drain electrode through a via hole in the buffer layer.

Optionally, in some embodiments of the present application, the second electrode layer further includes a third connection electrode, the third connection electrode is connected to the source electrode through a via hole in the buffer layer, and the third connection electrode is connected to the conductive channel.

Optionally, in some embodiments of the present application, the second electrode layer includes a fourth connection electrode, an orthographic projection of the fourth connection electrode on the substrate covers an orthographic projection of the metal trace electrode on the substrate, the first connection electrode is connected to the fourth connection electrode through a via hole in the passivation layer and the planarization layer, and the fourth connection electrode is connected to the metal trace electrode through a via hole in the buffer layer.

Optionally, in some embodiments of the present application, the display panel further includes:
  a fourth electrode layer, wherein the fourth electrode layer includes a fifth connection electrode, the fifth connection electrode is located between the metal trace electrode and the buffer layer, the fifth connection electrode covers the metal trace electrode, and the first connection electrode is connected to the fifth connection electrode through a via hole in the buffer layer.

Optionally, in some embodiments of the present application, a material of the first electrode layer includes one or more of copper, molybdenum, molybdenum titanium, aluminum, titanium, nickel, and alloys thereof.

Optionally, in some embodiments of the present application, a material of the fourth electrode layer includes one or more of indium tin oxide, indium gallium zinc oxide, molybdenum titanium, molybdenum titanium nickel, titanium, and alloys thereof.

The present application also provides a method of manufacturing a display panel, which includes the following steps:
  providing a substrate, and forming a first electrode layer on the substrate;
  performing photolithography patterning on the first electrode layer to obtain a drain electrode, a source electrode, and a metal trace electrode;
  forming a buffer layer on the first electrode layer;
  depositing a second electrode layer on the buffer layer, and performing photolithography patterning on the second electrode layer to obtain a conductive channel;
  forming a first insulating layer on the conductive channel; and
  forming a gate electrode on the first insulating layer.

Optionally, in some embodiments of the present application, the step of performing photolithography patterning on the first electrode layer to obtain a drain electrode, a source electrode, and a metal trace electrode includes the following steps:
coating a photoresist layer on the first electrode layer;
performing a photolithography process on the photoresist layer to obtain a photoresist pattern;
etching to remove the first electrode layer exposed by the photoresist pattern;
stripping off the photoresist pattern to obtain the drain electrode, the source electrode, and the metal trace electrode.

Optionally, in some embodiments of the present application, the manufacturing method further includes the following steps:
forming a passivation layer on the buffer layer, wherein the passivation layer covers the gate electrode;
forming a planarization layer on the passivation layer; and
forming a third electrode layer on the planarization layer, wherein the third electrode layer includes a first connection electrode and an anode electrode of a light-emitting organic light-emitting diode (OLED) device,
wherein the first connection electrode is connected to the first electrode layer through a via hole in the buffer layer, the passivation layer, and the planarization layer, and the anode electrode is connected to the drain electrode.

Optionally, in some embodiments of the present application, the step of performing photolithography patterning on the first electrode layer to obtain a drain electrode, a source electrode, and a metal trace electrode includes the following step:
performing photolithography patterning on the first electrode layer to obtain the drain electrode, the source electrode, a light-shielding electrode, and the metal trace electrode.

Optionally, in some embodiments of the present application, before the step of performing photolithography patterning on the first electrode layer to obtain a drain electrode, a source electrode, and a metal trace electrode, the manufacturing method further includes the following steps:
forming a fourth electrode layer on the first electrode layer; and
wherein the step of performing photolithography patterning on the first electrode layer to obtain the drain electrode, the source electrode, and the metal trace electrode includes the following steps:
coating a photoresist layer on the fourth electrode layer;
performing a photolithography process on the photoresist layer to obtain a photoresist pattern, wherein the photoresist pattern includes a first photoresist pattern and a second photoresist pattern;
etching to remove the first electrode layer and the fourth electrode layer exposed by the photoresist pattern;
stripping off the first photoresist pattern, and etching to remove the first electrode layer and the fourth electrode layer under the first photoresist pattern to obtain the drain electrode, the source electrode, and the metal trace electrode; and
stripping off the second photoresist pattern to obtain the fourth electrode layer on the metal trace electrode; and
wherein the step of forming a buffer layer on the first electrode layer includes the following steps:
forming the buffer layer on the fourth electrode layer and the first electrode layer.

Optionally, in some embodiments of the present application, the step of performing a photolithography process on the photoresist layer to obtain a photoresist pattern including a first photoresist pattern and a second photoresist pattern includes the following step:
performing the photolithography process on the photoresist layer using a half-tone mask to obtain the photoresist pattern, wherein the photoresist pattern includes the first photoresist pattern and the second photoresist pattern, and a thickness of the second photoresist pattern is greater than a thickness of the first photoresist pattern.

Optionally, in some embodiments of the present application, the step of stripping off the first photoresist pattern, and etching to remove the first electrode layer and the fourth electrode layer under the first photoresist pattern to obtain the drain electrode, the source electrode, and the metal trace electrode includes the following steps:
performing ashing and thinning treatment on the photoresist pattern to strip off the first photoresist pattern; and
etching to remove the first electrode layer and the fourth electrode layer located under the first photoresist pattern to obtain the drain electrode, the source electrode, and the metal trace electrode.

Optionally, in some embodiments of the present application, the step of depositing a second electrode layer on the buffer layer, and performing photolithography patterning on the second electrode layer to obtain a conductive channel includes the following step:
depositing the second electrode layer on the buffer layer, and performing photolithography patterning on the second electrode layer to obtain the conductive channel and a fourth connection electrode,
wherein an orthographic projection of the fourth connection electrode on the substrate covers an orthographic projection of the metal trace electrode on the substrate, the first connection electrode is connected to the fourth connection electrode through a via hole in the passivation layer and the planarization layer, and the fourth connection electrode is connected to the metal trace electrode through a via hole in the buffer layer.

Optionally, in some embodiments of the present application, a material of the first electrode layer includes one or more of copper, molybdenum, molybdenum titanium, aluminum, titanium, nickel, and alloys thereof.

Optionally, in some embodiments of the present application, a material of the fourth electrode layer includes one or more of indium tin oxide, indium gallium zinc oxide, molybdenum titanium, molybdenum titanium nickel, titanium, and alloys thereof.

The present application provides a display panel and a method of manufacturing the display panel. The display panel includes a substrate; a first electrode layer disposed on the substrate, wherein the first electrode layer includes a drain electrode, a source electrode, and a metal trace electrode; a buffer layer disposed on the first electrode layer; a second electrode layer disposed on the buffer layer, wherein the second electrode layer includes a conductive channel, and the drain electrode and the source electrode are respectively connected to the conductive channel; a first insulating layer disposed on the conductive channel; a gate electrode disposed on the first insulating layer; and a first connection electrode disposed on the buffer layer, wherein first connection electrode is connected to the metal trace electrode through a via hole in the buffer layer. In the present application, by disposing the drain electrode, the source electrode, and the metal trace electrode on the first electrode layer, the present application reduces at least one source/drain metal layer compared with the prior art, so that the present application can reduce a number of layers of photomasks during the manufacturing process of the display panel, which can effectively reduce the production cycle and production cost of the display panel.

BRIEF DESCRIPTION OF DRAWINGS

In order to more clearly illustrate the technical solutions of the embodiments of the present application, the drawings illustrating the embodiments will be briefly described below. Obviously, the drawings in the following description merely illustrate some embodiments of the present invention. Other drawings may also be obtained by those skilled in the art according to these figures without paying creative work.

FIG. 6 is a schematic diagram of a third structure of a display panel provided by the present application.

FIG. 7 is a flowchart of a third embodiment of a method of manufacturing a display panel provided by the present application.

FIG. 12 is a flowchart of step 12 of the fifth embodiment of the method of manufacturing a display panel provided by the present application.

DETAILED DESCRIPTION OF PREFERRED EMBODIMENTS

Figure 1:
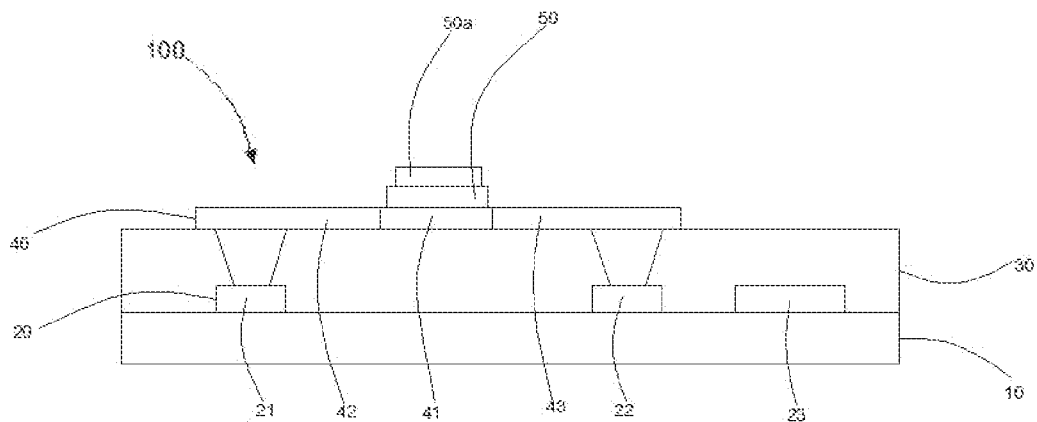
FIG. 1 is a schematic diagram of a first structure of a display panel provided by the present application.

The technical solutions in the embodiments of the present application will be clearly and completely described below. Obviously, the described embodiments are only a part of the embodiments of the present application, but not all of the embodiments. Based on the embodiments in the present application, all other embodiments obtained by a person of ordinary skill in the art without creative efforts shall fall within the protection scope of the present application.

In the description of the present application, it should be understood that the terms "center", "longitudinal", "transverse", "length", "width", "thickness", "upper", "lower", "front", "Rear", "left", "right", "vertical", "horizontal", "top", "bottom", "inside", "outside", "clockwise", "counterclockwise", and the like are based on the orientation or positional relationship shown in the drawings, and is merely for the convenience of describing the present invention and simplifying the description, rather than indicating or implying that the device or element referred to must have a specific orientation, structure and operation in a specific orientation, which should not be construed as limitations on the present invention. In addition, the terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present application, the meaning of "a plurality" is two or more, unless specifically defined otherwise.

In this specification, a transistor refers to an element including at least three terminals of a gate electrode, a drain electrode, and a source electrode. The transistor has a channel region between the drain (drain terminal, drain region, or drain) and source (source terminal, source region, or source) and current can flow through the drain, channel region, and source. It should be noted that in this specification, the channel region refers to a region through which current mainly flows. When using transistors with opposite polarities, when a direction of current changes during circuit operation, or the like, functions of the "source" and "drain" may be interchanged with each other. Therefore, in this specification, the "source" and "drain" may also be interchanged with each other.

The present application provides a display panel 100 and a method of manufacturing the display panel 100, which will be described in detail below. It should be noted that the description order of the following embodiments is not intended to limit the preferred order of the embodiments of the present application.

Referring to FIG. 1, FIG. 1 is a schematic diagram of a first structure of a display panel 100 provided by the present application. The present application provides a display panel 100, which includes a substrate 10, a first electrode layer 20, a buffer layer 30, a second electrode layer 40, a first insulating layer 50, and a gate electrode 50a.

The first electrode layer 20 is disposed on the substrate 10, and the first electrode layer 20 includes a drain electrode 21, a source electrode 22, and a metal trace electrode 23; the buffer layer 30 is disposed on the first electrode on the electrode layer 20. In addition, in some embodiments, the substrate 10 is a flexible substrate, and a material of the first electrode layer 20 contains one or more of copper, molybdenum, molybdenum-titanium, aluminum, titanium, nickel, and alloys thereof.

The second electrode layer 40 is disposed on the buffer layer 30, the second electrode layer 40 includes a conductive channel 41, and the drain electrode 21 and the source electrode 22 are respectively connected to the conductive channel 41; the first insulating layer 50 is disposed on the conductive channel 41; and the gate electrode 50 a is disposed on the first insulating layer 50.

By arranging the drain electrode 21, the source electrode 22, and the metal trace electrode 23 on the first electrode layer 20 in the present application, compared with the prior art, the present application reduces at least one source/drain metal layer, that is, the drain electrode 21, the source electrode 22, and the metal trace electrode 23 can be obtained by a photolithography process with one layer of photomask, so that a number of the photomask can be reduced in the manufacturing process of the display panel 100. In conclusion, the present application can effectively reduce a manufacturing cycle and manufacturing cost of the display panel 100.

Figure 2:
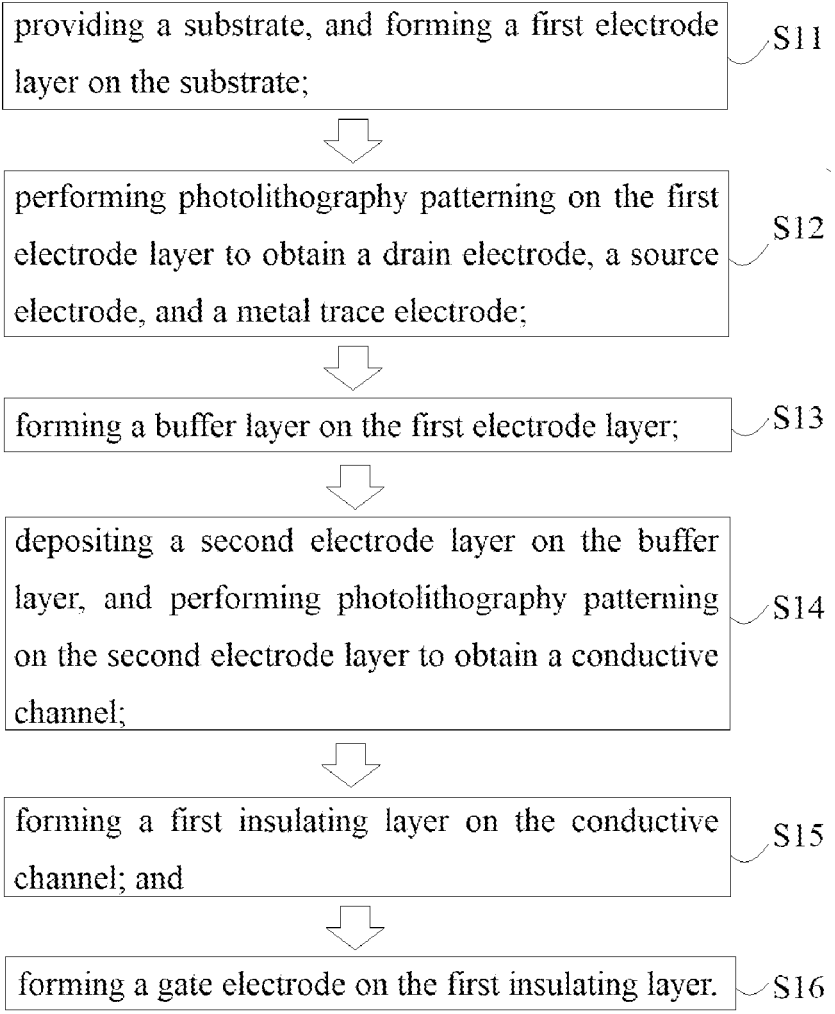
FIG. 2 is a flowchart of a first embodiment of a method of manufacturing a display panel provided by the present application.

Referring to FIG. 2, FIG. 2 is a flowchart of a first embodiment of a method of manufacturing the display panel 100 provided by the present application. The embodiment of the present application also provides a method of manufacturing the display panel 100, which includes the following steps:

S11, providing a substrate 10, and forming a first electrode layer 20 on the substrate 10;

S12, performing photolithography patterning on the first electrode layer 20 to obtain a drain electrode 21, a source electrode 22, and a metal trace electrode 23;

S13, forming a buffer layer 30 on the first electrode layer 20;

S14, depositing a second electrode layer 40 on the buffer layer 30, and performing photolithography patterning on the second electrode layer 40 to obtain a conductive channel 41;

S15, forming a first insulating layer 50 on the conductive channel 41; and

S16, forming a gate electrode 50a on the first insulating layer 50.

In the present application, the first electrode layer 20 is patterned by photolithography at one time to obtain the drain electrode 21, the source electrode 22 and the metal trace electrode 23. Compared with the prior art, the present application reduces at least one layer of source and drain metal layer, that is, the present application enables the reduction of at least one photomask in the manufacturing process of the display panel 100, thereby effectively reducing the manufacturing cycle and manufacturing cost of the display panel 100.

Figure 3:
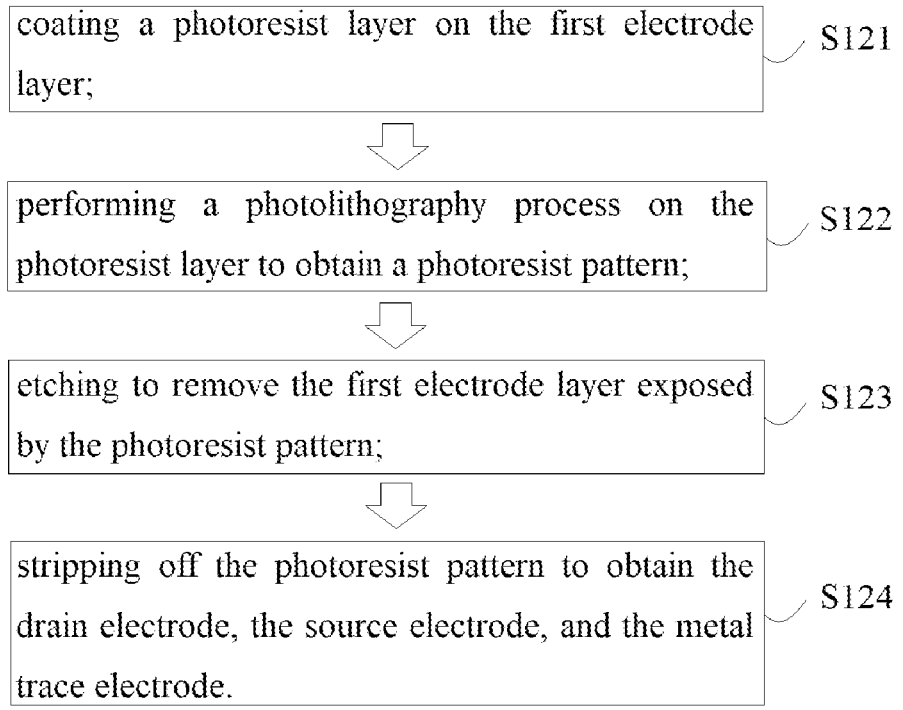
FIG. 3 is a flowchart of step S12 of the first embodiment of the method of manufacturing the display panel provided by the present application.

Referring to FIG. 3, FIG. 3 is a flowchart of step S12 of the first embodiment of the method of manufacturing the display panel 100 provided by the present application. In some embodiments, the step S12 includes the following steps:

S121, coating a photoresist layer on the first electrode layer 20;

S122, performing photolithography processing on the photoresist layer to obtain a photoresist pattern;

S123, etching and removing the first electrode layer 20 exposed by the photoresist pattern;

S124, stripping off the photoresist pattern to obtain the drain electrode 21, the source electrode 22, and the metal trace electrode 23.

Figure 4:
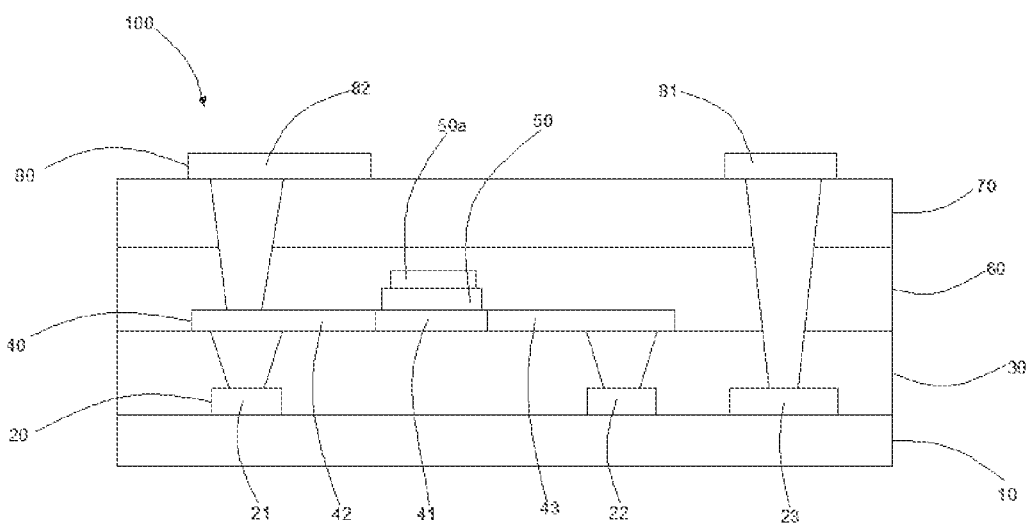
FIG. 4 is a schematic diagram of a second structure of a display panel provided by the present application.

Referring to FIG. 4, FIG. 4 is a schematic diagram of the second structure of the display panel 100 provided by the present application. The difference from the display panel provided in FIG. 1 is that the display panel 100 further includes:

a passivation layer 60 disposed on the buffer layer 30 and covering the gate electrode 50a;

a planarization layer 70 disposed on the passivation layer 60; and a third electrode layer 80 disposed on the planarization layer 70, wherein the third electrode layer 80 includes the first connection electrode 81 and the anode electrode 82 of the light-emitting OLED device.

The first connection electrode 81 is connected to the metal trace electrode 23 through the via hole in the buffer layer 30, the passivation layer 6, and the planarization layer 70, and the anode electrode 82 is connected to the drain electrode 21. The first connection electrode 81 serves as a connection terminal of the metal trace electrode 23.

In the present application, the drain electrode 21, the source electrode 22, and the metal trace electrode 23 are disposed on the first electrode layer 20, the conductive channel 41 is disposed on the second electrode layer 40, and the gate electrode 50a is disposed on the conductive channel 41, and no dielectric layer is provided, so that the number of layers of inorganic films can be reduced. Since the buffer layer 30 separates the drain electrode 21 and the source electrode 22 from the gate electrode 50a, insulation between the drain/source electrodes 21/22 and the gate electrode 50a can be guaranteed even without a dielectric layer 22.

In addition, in some embodiments, the second electrode layer 40 further includes a second connection electrode 42, and the anode electrode 82 is connected to the second connection electrode 82 through the via hole in the passivation layer 60 and the planarization layer 70. The connection electrode 42 is connected, and the second connection electrode 42 is connected to the drain electrode 21 through the via hole in the buffer layer 30. By providing the second connection electrode 42 as an intermediate connection electrode between the anode electrode 82 and the drain electrode 21, the depth of the via hole can be reduced, the process risk caused by the difference between deep and shallow holes during exposure and etching is reduced, and the process stability and process feasibility are improved.

Further, in some embodiments, the second connection electrode 42 is connected to the conductive channel 41. On the basis of the above, the connection between the conductive channel 41 and the drain electrode 21 is realized through the second connection electrode 42, and the numbers of connection electrodes and via holes can be reduced.

In some embodiments, the second electrode layer 40 further includes a third connection electrode 43, the third connection electrode 43 is connected to the source electrode 22 through a via hole in the buffer layer 30, and the third connection electrode 43 is connected to the source electrode 22 through a via hole in the buffer layer 30. The third connection electrode 43 is connected to the conductive channel 41.

It should be noted that the above-mentioned embodiment of the display panel 100 only describes the above-mentioned structure. It can be understood that, in addition to the above-mentioned structure, the display panel 100 of this embodiment of the present application may also include any other necessary structures as required, such as a polarizer, a cover plate, etc. which are not specifically limited here.

Figure 5:
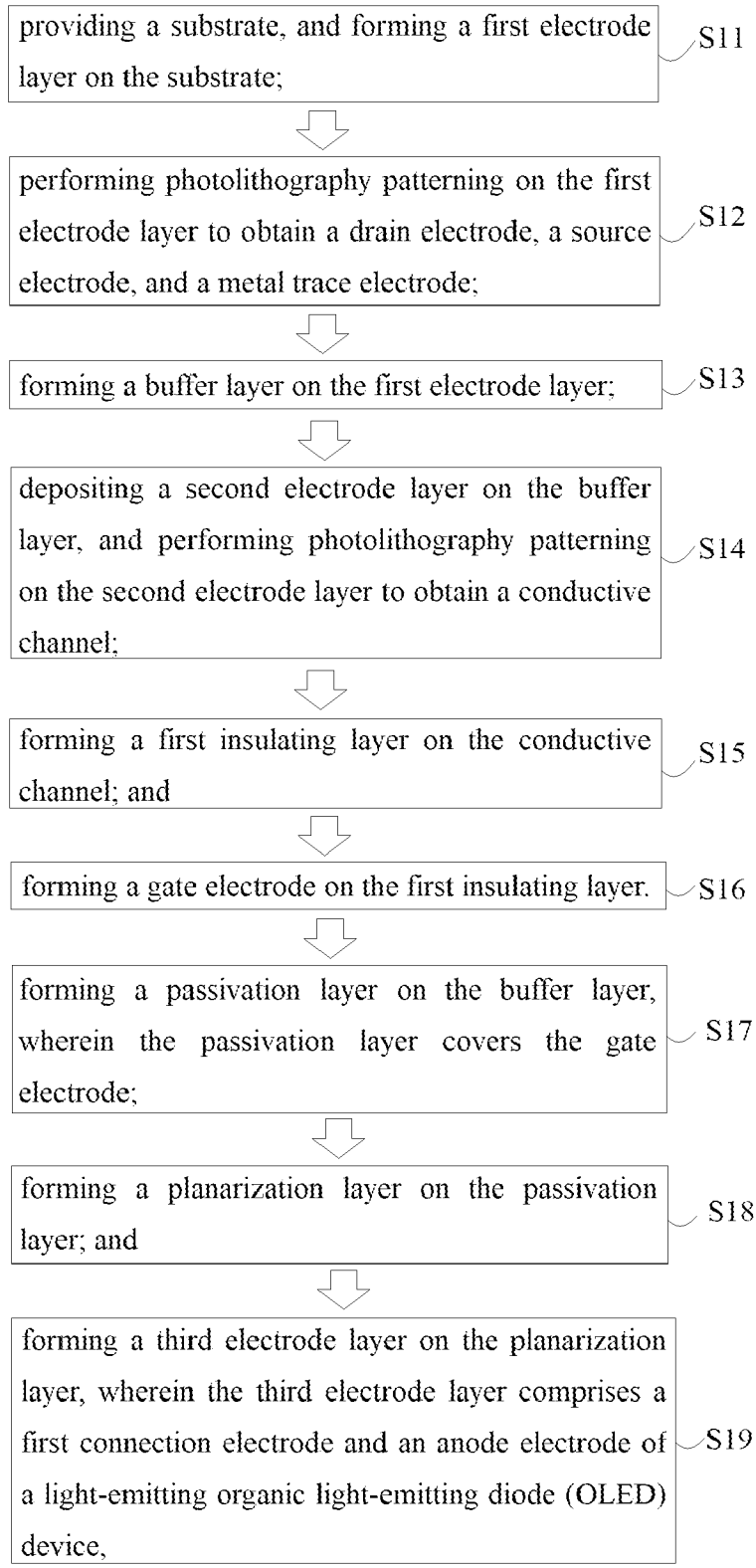
FIG. 5 is a flowchart of a second embodiment of a method of manufacturing a display panel provided by the present application.

Referring to FIG. 5, FIG. 5 is a flowchart of a second embodiment of a method of manufacturing a display panel 100 provided by the present application. The difference from the method of manufacturing the display panel 100 provided in FIG. 2 is that the method further includes the following steps:

S17, forming a passivation layer 60 on the buffer layer 30, the passivation layer 60 covering the gate electrode 50a;

S18, forming a planarization layer 70 on the passivation layer 60; and

S19, forming a third electrode layer 80 on the planarization layer 70, wherein the third electrode layer 80 includes a first connection electrode 81 and an anode electrode 82 of the light-emitting OLED device.

The first connection electrode 81 is connected to the first electrode layer 20 through the via hole in the buffer layer 30, the passivation layer 60, and the planarization layer 70, and the anode electrode 82 is connected to the drain electrode 21.

Referring to FIG. 6, FIG. 6 is a schematic diagram of a third structure of the display panel 100 provided by the present application. The difference from the display panel 100 provided in FIG. 1 is that the first electrode layer 20 includes a drain electrode 21 and a source electrode. 22. The light-shielding electrode 24 and the metal trace electrode 23, the orthographic projection of the light-shielding electrode 24 on the substrate 10 covers the orthographic projection of the conductive channel 41 on the substrate 10. The drain electrode 21, the source electrode 22, the light-shielding electrode 24, and the metal trace electrode 23 are arranged on the first electrode layer 20 at the same time, which not only reduces one source/drain metal layer, but also an additional light-shielding layer can be omitted to reduce the production cost.

Further, in some embodiments, the drain electrode 21, the light-shielding electrode 24, the source electrode 22, and the metal trace electrode 23 are arranged at intervals in sequence, and the light-shielding electrode 24 is arranged between the drain electrode 21 and the source electrode 22 to facilitate the arrangement of the light-shielding electrode 24 corresponding to the conductive channel 41, while increasing the insulating distance between the drain electrode 21 and the source electrode 22 to enhance the insulating effect of the drain electrode 21 and the source electrode 22.

Referring to FIG. 7, FIG. 7 is a flowchart of a third embodiment of the method of manufacturing the display panel 100 provided by the present application. The difference from the method of manufacturing the display panel 100 provided in FIG. 2 is that the step S12 includes:

The first electrode layer 20 is patterned by photolithography to obtain the drain electrode 21, the source electrode 22, the light-shielding electrode 24, and the metal trace electrode 23. In the present application, the first electrode layer 20 is patterned by photolithography to obtain the drain electrode 21, the source electrode 22, the light-shielding electrode 24, and the metal trace electrode 23 at one time, which can omit an additional light-shielding layer to reduce the production cost.

Figure 8:
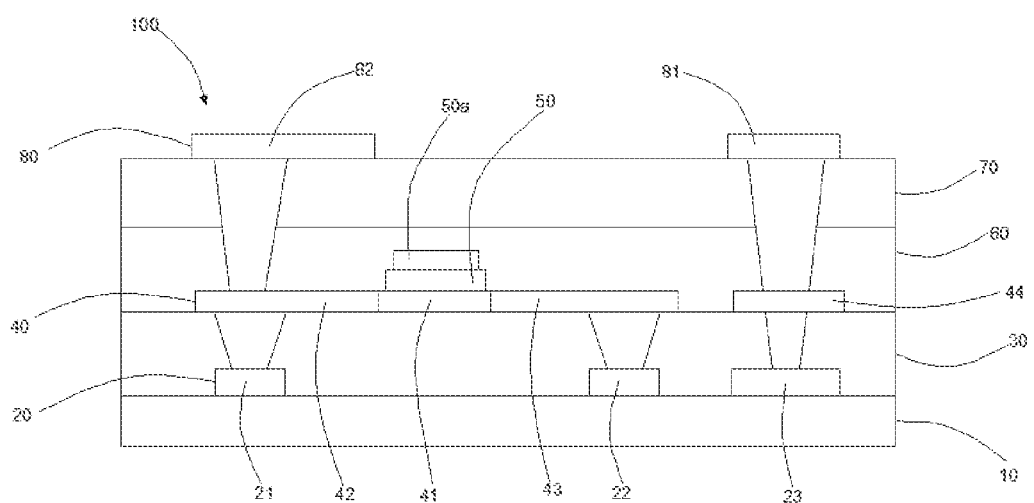
FIG. 8 is a schematic diagram of a fourth structure of a display panel provided by the present application.

Referring to FIG. 8, FIG. 8 is a schematic diagram of a fourth structure of the display panel 100 provided by the present application. The difference from the display panel 100 provided in FIG. 4 is that the second electrode layer 40 includes a fourth connection electrode 44. The orthographic projection of the fourth connection electrode 44 on the substrate 10 covers the orthographic projection of the metal trace electrode 23 on the substrate 10, the first connection electrode 81 is connected to the fourth connection electrode 44 through the via hole in the passivation layer 60 and the planarization layer 70, and the fourth connection electrode 44 is connected to the metal trace electrode 23 through the via hole in the buffer layer 30.

By providing the fourth connection electrode 44 as an intermediate connection electrode between the first connection electrode 81 and the metal trace electrode 23, the depth of the via hole can be reduced, and the process risk caused by the difference between deep and shallow holes during exposure and etching is reduced, and the process stability and process feasibility are improved.

Moreover, in the process of making the bonding terminal of the metal trace electrode 23 in the existing display panel 100, the etching solution will corrode the metal on the metal trace electrodes 23. In the present application, a fourth connection electrode 44 is provided on the second electrode layer 40, and the orthographic projection of the fourth connection electrode 44 on the substrate 10 covers the orthographic projection of the metal wiring electrode 23 on the substrate 10, so that the influence of the etching solution on the metal on the metal trace electrode 23 during the process of making the bonding terminal of the metal trace electrode 23 can be prevented, and reduce the abnormal reliability of the metal trace electrode 23 at the same time.

Figure 9:
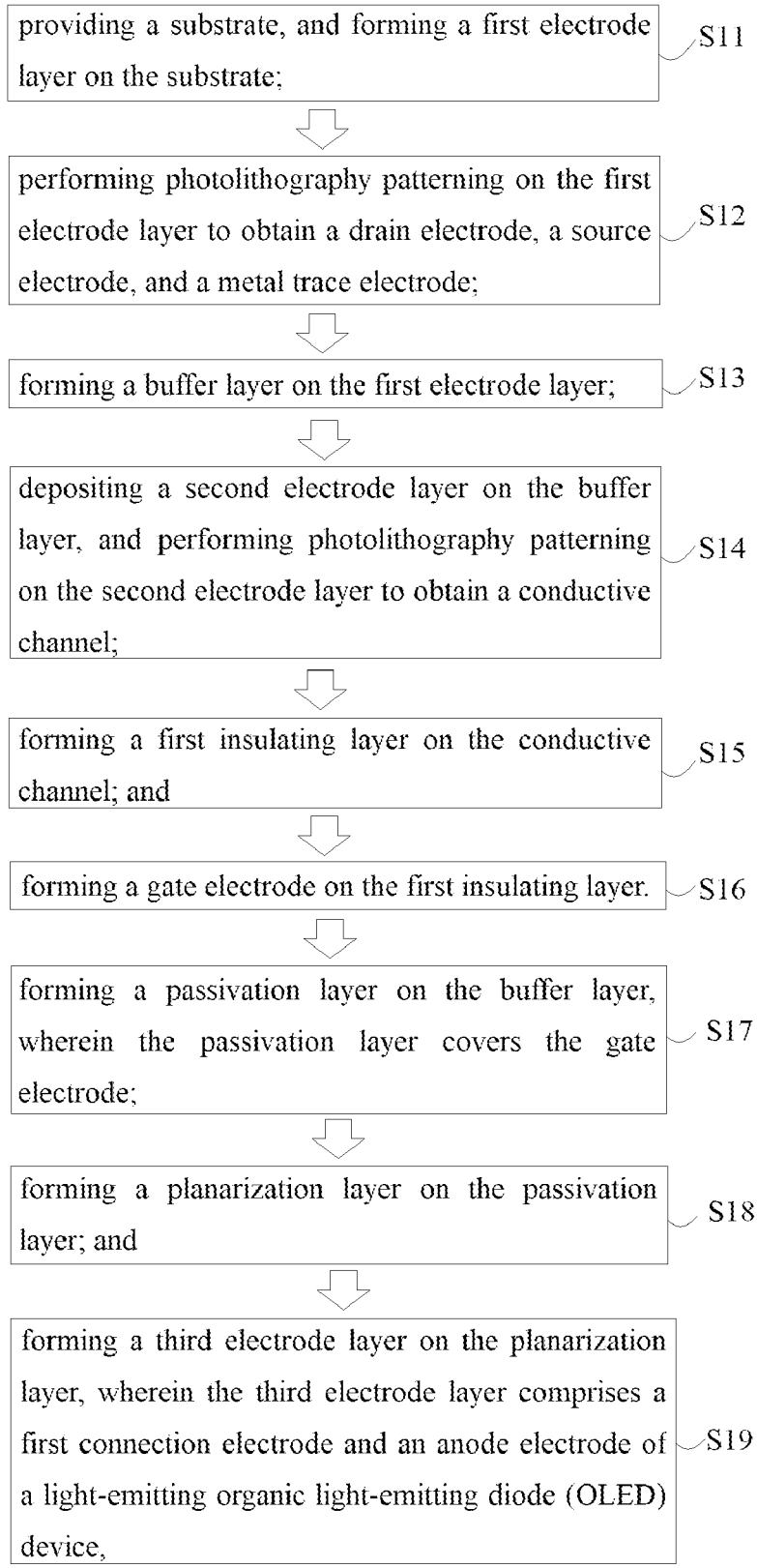
FIG. 9 is a flowchart of a fourth embodiment of a method of manufacturing a display panel provided by the present application.

Referring to FIG. 9, FIG. 9 is a flowchart of a fourth embodiment of the method of manufacturing the display panel 100 provided by the present application. The difference from the method of manufacturing the display panel 100 provided in FIG. 5 is that the step S14 includes:

A second electrode layer 40 is deposited on the buffer layer 30, and photolithographic patterning is performed on the second electrode layer 40 to obtain a conductive channel 41 and a fourth connection electrode 44.

The orthographic projection of the fourth connection electrode 44 on the substrate 10 covers the orthographic projection of the metal trace electrode 23 on the substrate 10, the first connection electrode 81 is connected to the fourth connection electrode 44 through the via hole in the passivation layer 60 and the planarization layer 70, and the fourth connection electrode 44 is connected to the metal trace electrode 23 through the via hole in the buffer layer 30.

In the present application, the conductive channel 41 and the fourth connection electrode 44 can be obtained by one-time photolithography patterning on the same electrode layer, which will not have much impact on the manufacturing cost of the product, and can reduce the depth of the via hole, and reduce the process risk caused by the difference between deep and shallow holes during exposure and etching, while preventing the influence of the etching solution on the metal on the metal trace electrode 23.

Figure 10:
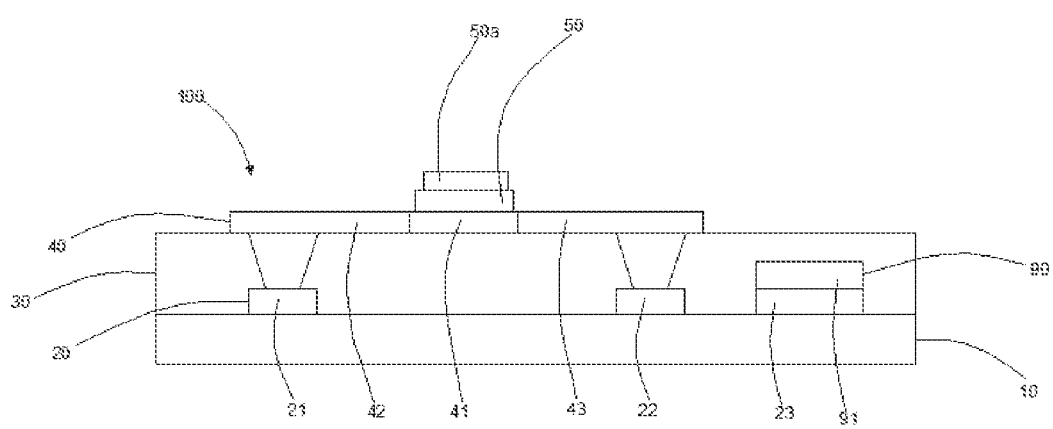
FIG. 10 is a schematic diagram of a fifth structure of the display panel provided by the present application.

Referring to FIG. 10, FIG. 10 is a schematic diagram of a fifth structure of the display panel 100 provided by the present application. The difference from the display panel 100 provided in FIG. 1 is that the display panel 100 further includes: a fourth electrode layer 90, the fourth electrode layer 90 includes a fifth connection electrode 91, the fifth connection electrode 91 is located between the metal trace electrode 23 and the buffer layer 30, the fifth connection electrode 91 covers the metal on the metal trace electrode 23, and the first connection electrode 81 is connected to the fifth connection electrode 91 through the via hole in the buffer layer 30.

In the existing display panel 100, during the process of making the bonding terminal of the metal trace electrode 23, the etching solution will corrode the metal on the metal trace electrodes 23, and the coverage of the buffer layer 30 and the metal trace electrodes 23 are originally defective. Both of the above-mentioned two situations lead to abnormal reliability of the metal trace electrode 23 after the bonding terminal is bonded and connected to the trace, which impacts the quality of the display panel 100.

In view of above, in the present application, the fifth connection electrode 91, the metal trace electrode 23, the fifth connection electrode 91, and the buffer layer 30 are stacked in sequence, and the fifth connection electrode 91 covers the metal trace electrode 23, the first connection electrode 81 is connected to the fifth connection electrode 91 through the via hole in the buffer layer 30, and the fifth connection electrode 91 is further connected to the metal trace electrode 23, so that the etching solution will not impact the metal on the metal trace electrode 23 during the process of making the bonding terminal of the metal trace electrode 23, and can also improve the coverage of the metal trace electrode 23, so as to solve the problem that metal trace electrode 23 is prone to abnormal reliability.

Further, in some embodiments, the material of the fourth electrode layer 90 includes one or more of indium tin oxide, indium gallium zinc oxide, molybdenum titanium, molybdenum titanium nickel, titanium, and alloys thereof.

Figure 11:
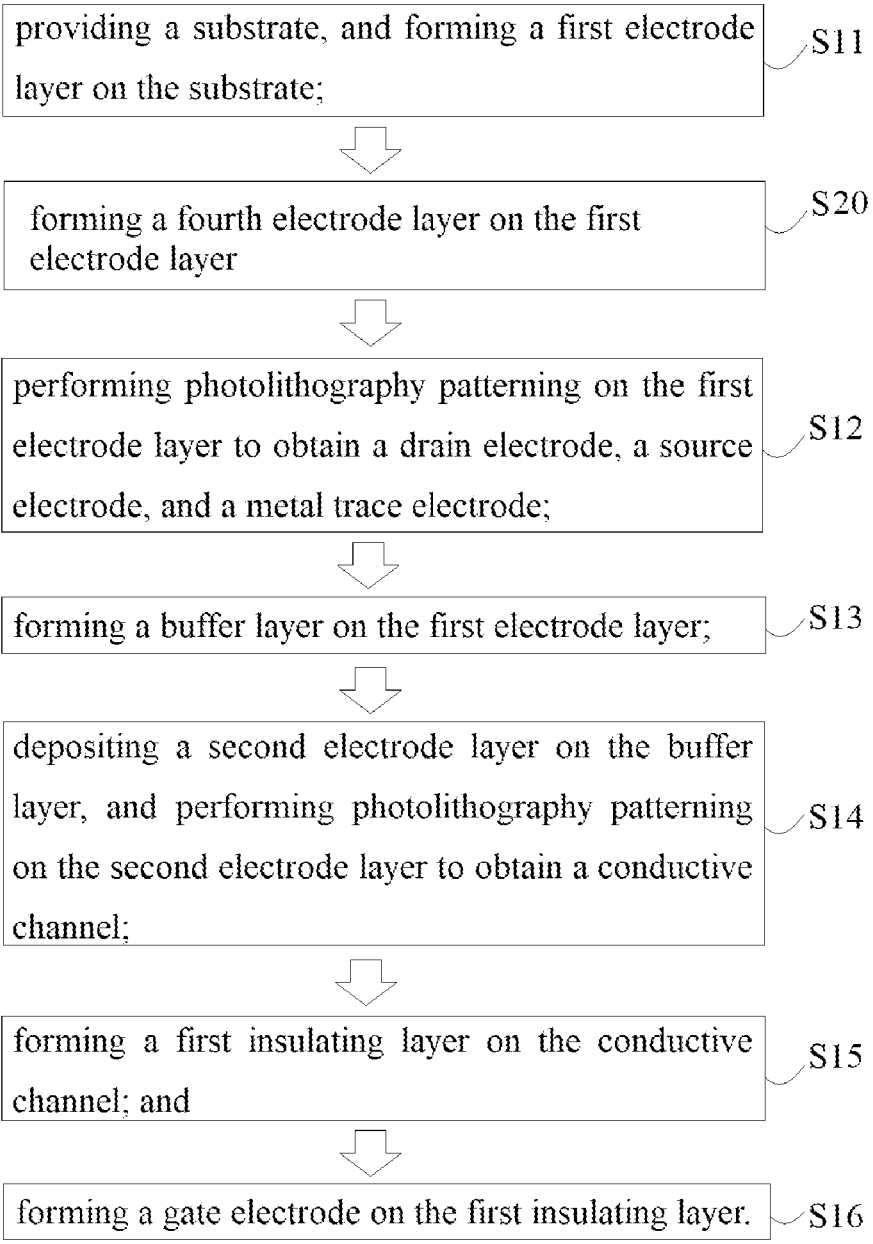
FIG. 11 is a flowchart of a fifth embodiment of a method of manufacturing a display panel provided by the present application.

Referring to FIG. 11, FIG. 11 is a flowchart of a fifth embodiment of the method of manufacturing the display panel 100 provided by the present application, which is different from the method of manufacturing the display panel 100 provided in FIG. 2 in that: before the step S12, the method of manufacturing the display panel 100 further includes the following steps:

S20, forming a fourth electrode layer 90 on the first electrode layer 20.

Referring to FIG. 12, FIG. 12 is a flowchart of step S12 of the fifth embodiment of the method of manufacturing the display panel 100 provided by the present application, wherein the step S12 includes the following steps:

S125, coating a photoresist layer on the fourth electrode layer 90;

S126, performing photolithography processing on the photoresist layer to obtain a photoresist pattern, wherein the photoresist pattern includes a first photoresist pattern and a second photoresist pattern;

S127, etching to remove the first electrode layer 20 and the fourth electrode layer 90 exposed by the photoresist pattern;

S128, stripping off the first photoresist pattern, and etching to remove the first electrode layer 20 and the fourth electrode layer 90 under the first photoresist pattern to obtain the drain electrode 21, the source electrode 22, and the metal trace electrode 23; and S129, stripping off the second photoresist pattern to obtain the fourth electrode layer 91 on the metal trace electrode 23.

In the present application, by performing photolithography patterning on the first electrode layer 20 and the fourth electrode layer 90 at one time, not only the drain electrode 21, the source electrode 22, and the metal trace electrode 23 can be obtained, but also the fifth connection electrode 91 located on the metal trace electrode 23 can be obtained, thereby improving the processing efficiency and reducing the production cost.

Referring to FIG. 11, the step S13 includes: forming a buffer layer 30 on the fourth electrode layer 90 and the first electrode layer 20.

In some embodiments, the step S126 includes:

performing the photolithography process on the photoresist layer using a half-tone mask to obtain the photoresist pattern, wherein the photoresist pattern includes the first photoresist pattern and the second photoresist pattern, and a thickness of the second photoresist pattern is greater than a thickness of the first photoresist pattern.

The half-tone mask includes a transparent area, an opaque area, and a second translucent area, the opaque area corresponds to the second photoresist pattern, and the translucent area corresponds to the first photoresist pattern. The present application utilizes the half-tone mask to form two photoresist patterns with different thicknesses at one time, which can reduce the production steps and greatly improve the working efficiency.

Figures 13, 14:
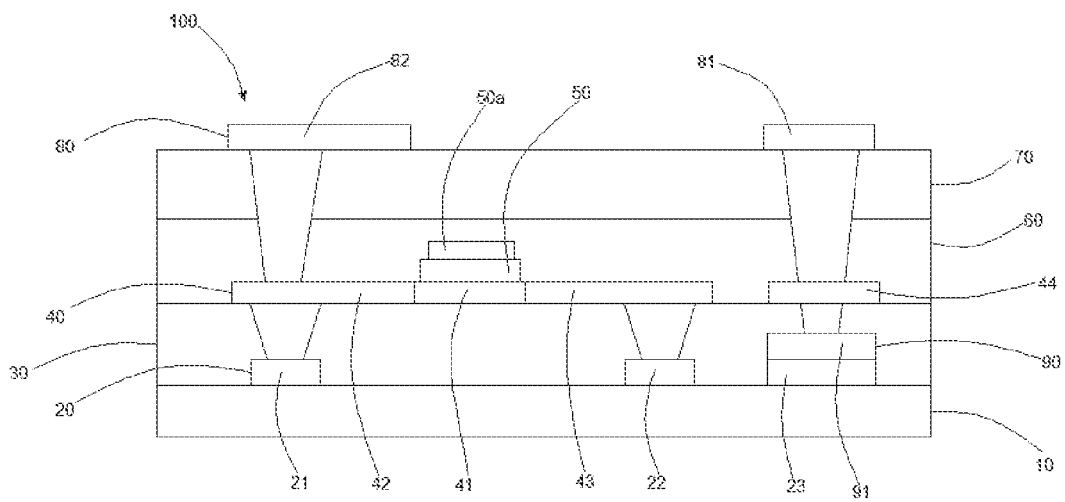
FIG. 13 is a flowchart of step 128 of the fifth embodiment of the method of manufacturing a display panel provided by the present application.
FIG. 14 is a schematic diagram of a sixth structure of the display panel provided by the present application.

Referring to FIG. 13, FIG. 13 is a flowchart of step S128 of the fifth embodiment of the method of manufacturing the display panel 100 provided by the present application. Further, in some embodiments, the step S128 includes the following steps:

S1281, performing ashing and thinning treatment on the photoresist pattern to strip off the first photoresist pattern;

S1282, etching to remove the first electrode layer 20 and the fourth electrode layer 90 located under the first photoresist pattern to obtain the drain electrode 21, the source electrode 22, and the metal trace electrode 23.

Referring to FIG. 14, FIG. 14 is a schematic diagram of the sixth structure of the display panel 100 provided by the present application. The difference from the display panel 100 provided in FIG. 8 is that the display panel 100 further includes: a fourth electrode layer 90, the fourth electrode layer 90 includes a fifth connection electrode 91, the fifth connection electrode 91 is located between the metal trace electrode 23 and the buffer layer 30, the fifth connection electrode 91 covers the metal on the metal trace electrode 23, and the first connection electrode 81 is connected to the fifth connection electrode 91 through the via hole in the buffer layer 30.

In the existing display panel 100, during the process of making the bonding terminal of the metal trace electrode 23, the etching solution will corrode the metal on the metal trace electrodes 23, and the coverage of the buffer layer 30 and the metal trace electrodes 23 originally has defects, both of the above-mentioned two situations lead to abnormal reliability of the metal trace electrode 23 after the bonding terminal is bonded and connected to the trace, which impacts the quality of the display panel 100.

In view of above, in the present application, the fifth connection electrode 91, the metal trace electrode 23, the fifth connection electrode 91, and the buffer layer 30 are stacked in sequence, and the fifth connection electrode 91 covers the metal trace electrode 23, the first connection electrode 81 is connected to the fifth connection electrode 91 through the via hole in the buffer layer 30, and the fifth connection electrode 91 is further connected to the metal trace electrode 23, so that the etching solution will not impact the metal on the metal trace electrode 23 during the process of making the bonding terminal of the metal trace electrode 23, and can also improve the coverage of the metal trace electrode 23, so as to solve the problem that metal trace electrode 23 is prone to abnormal reliability.

Further, in some embodiments, the material of the fourth electrode layer 90 includes one or more of indium tin oxide, indium gallium zinc oxide, molybdenum titanium, molybdenum titanium nickel, titanium, and alloys thereof.

Figure 15:
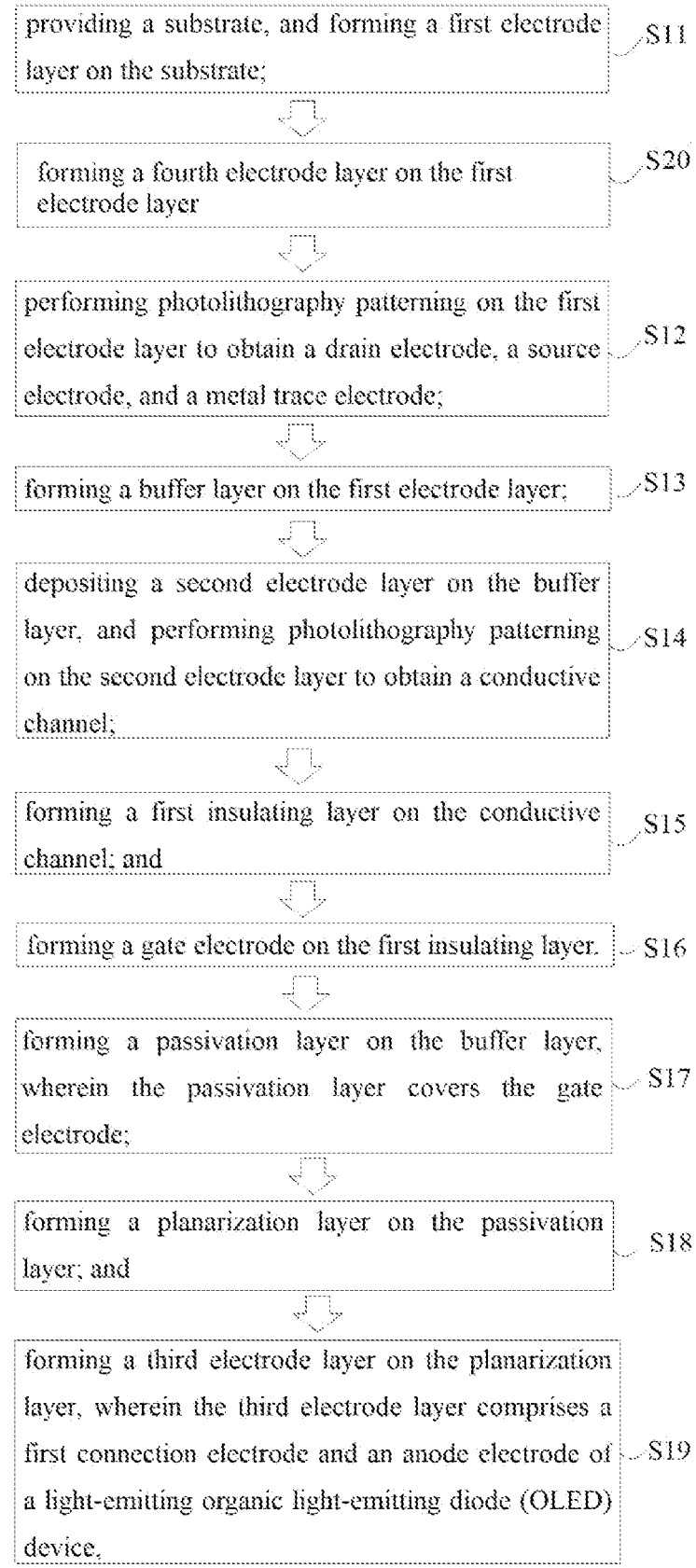
FIG. 15 is a flowchart of a sixth embodiment of a method of manufacturing a display panel provided by the present application.

Referring to FIG. 15, FIG. 15 is a flowchart of the sixth embodiment of the method of manufacturing the display panel 100 provided by the present application, which is different from the method of manufacturing the display panel 100 provided in FIG. 9 is that the method of manufacturing the display panel 100 includes the following steps:

S20, forming a fourth electrode layer 90 on the first electrode layer 20.

The step S12 includes the following steps:

coating a photoresist layer on the fourth electrode layer 90;

performing a photolithography process on the photoresist layer to obtain a photoresist pattern, wherein the photoresist pattern includes a first photoresist pattern and a second photoresist pattern;

etching to remove the first electrode layer 20 and the fourth electrode layer 90 exposed by the photoresist pattern;

stripping off the first photoresist pattern, and etching to remove the first electrode layer and the fourth electrode layer under the first photoresist pattern to obtain the drain electrode, the source electrode, and the metal trace electrode; and stripping off the first photoresist pattern, and etching to remove the first electrode layer 20 and the fourth electrode layer 90 under the first photoresist pattern to obtain the drain electrode 21, the source electrode 22, and the metal trace electrode 23; and stripping off the second photoresist pattern to obtain the fourth electrode layer 91 on the metal trace electrode 23.

In the present application, by performing photolithography patterning on the first electrode layer 20 and the fourth electrode layer 90 at one time, not only the drain electrode 21, the source electrode 22, and the metal trace electrode 23 can be obtained, but also the fifth connection electrode 91 located on the metal trace electrode 23 can be obtained, thereby improving the processing efficiency and reduces the production cost.

Referring to FIG. 15, the step S13 includes: forming a buffer layer 30 on the fourth electrode layer 90 and the first electrode layer 20.

The display panel and the method of manufacturing a display panel provided by the embodiments of the present application have been described in detail above. Specific examples are used in this document to explain the principles and implementation of the present invention. The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not depart the spirit of the corresponding technical solutions beyond the scope of the technical solutions of the embodiments of the present application.

What is claimed is:

1. A display panel, comprising:
   a substrate;
   a first electrode layer disposed on the substrate, wherein the first electrode layer comprises a drain electrode, a source electrode, and a metal trace electrode;
   a buffer layer disposed on the first electrode layer;
   a second electrode layer disposed on the buffer layer, wherein the second electrode layer comprises a conductive channel, and the drain electrode and the source electrode are respectively connected to the conductive channel;
   a first insulating layer disposed on the conductive channel; and
   a gate electrode disposed on the first insulating layer;
   wherein the display panel further comprises a fourth electrode layer, wherein the fourth electrode layer comprises a fifth connection electrode, the fifth connection electrode is located between the metal trace electrode and the buffer layer, the fifth connection electrode is covered by the buffer layer, the fifth connection electrode covers the metal trace electrode, and the first connection electrode is connected to the fifth connection electrode through a via hole in the buffer layer.

2. The display panel according to claim 1, wherein the first electrode layer further comprises a light-shielding electrode, and an orthographic projection of the light-shielding electrode on the substrate covers an orthographic projection of the conductive channel on the substrate projection.

3. The display panel according to claim 2, wherein the drain electrode, the light-shielding electrode, the source electrode, and the metal trace electrode are spaced from each other.

4. The display panel according to claim 1, wherein the display panel further comprises:
   a passivation layer disposed on the buffer layer and covering the gate electrode;
   a planarization layer disposed on the passivation layer; and
   a third electrode layer disposed on the planarization layer, wherein the third electrode layer comprises a first connection electrode and an anode electrode of a light-emitting organic light-emitting diode (OLED) device;
   wherein the first connection electrode is connected to the metal trace electrode through a via hole in the buffer layer, the passivation layer, and the planarization layer, and the anode electrode is connected to the drain electrode.

5. The display panel according to claim 4, wherein the second electrode layer further comprises a second connection electrode, the anode electrode is connected to the second connection electrode through a via hole in the passivation layer and the planarization layer, and the second connection electrode is connected to the drain electrode through a via hole in the buffer layer.

6. The display panel according to claim 4, wherein the second electrode layer comprises a fourth connection electrode, an orthographic projection of the fourth connection electrode on the substrate covers an orthographic projection of the metal trace electrode on the substrate, the first connection electrode is connected to the fourth connection electrode through a via hole in the passivation layer and the planarization layer, and the fourth connection electrode is connected to the metal trace electrode through a via hole in the buffer layer.

7. The display panel according to claim 1, wherein the second electrode layer further comprises a third connection electrode, the third connection electrode is connected to the source electrode through a via hole in the buffer layer, and the third connection electrode is connected to the conductive channel.

8. The display panel according to claim 1, wherein a material of the first electrode layer comprises one or more of copper, molybdenum, molybdenum titanium, aluminum, titanium, nickel, and alloys thereof.

9. The display panel according to claim 1, wherein a material of the fourth electrode layer comprises one or more of indium tin oxide, indium gallium zinc oxide, molybdenum titanium, molybdenum titanium nickel, titanium, and alloys thereof.

* * * * *